(12) United States Patent
Lee

(10) Patent No.: US 7,649,156 B2
(45) Date of Patent: Jan. 19, 2010

(54) LASER ANNEALING APPARATUS FOR PROCESSING SEMICONDUCTOR DEVICES IN INLINE MANNER

(75) Inventor: Hong-Ro Lee, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 464 days.

(21) Appl. No.: 10/995,473

(22) Filed: Nov. 24, 2004

(65) Prior Publication Data

US 2005/0133565 A1 Jun. 23, 2005

(30) Foreign Application Priority Data

Nov. 27, 2003 (DE) ...................... 10-2003-0084899

(51) Int. Cl.
*B23K 26/06* (2006.01)
(52) U.S. Cl. ............................. 219/121.73; 219/121.74
(58) Field of Classification Search ............ 219/121.73, 219/121.74, 121.6; 198/459.2–572
See application file for complete search history.

(56) References Cited

U.S. PATENT DOCUMENTS

| | | | |
|---|---|---|---|
| 4,292,093 A * | 9/1981 | Ownby et al. ................. 134/1.3 |
| 4,965,829 A * | 10/1990 | Lemelson .................... 382/101 |
| 5,948,291 A * | 9/1999 | Neylan et al. .......... 219/121.77 |
| 5,961,860 A * | 10/1999 | Lu et al. ................. 219/121.65 |
| 6,580,053 B1* | 6/2003 | Voutsas .................. 219/121.66 |
| 2003/0136769 A1* | 7/2003 | Lin et al. ................ 219/121.69 |

FOREIGN PATENT DOCUMENTS

JP 59-157278 * 9/1984

OTHER PUBLICATIONS translation of JP 59-157278 Taguchi et al. Sep. 1984.*

* cited by examiner

*Primary Examiner*—M. Alexandra Elve
(74) *Attorney, Agent, or Firm*—H.C. Park & Associates, PLC

(57) ABSTRACT

A laser annealing apparatus is provided, which can simultaneously process a plurality of moving semiconductor devices in an inline manner using one annealing laser. The apparatus may include a laser beam emitting unit, which emits laser beams to target regions of a to-be-processed object. Also included may be a plurality of first nozzles and a plurality of second nozzles, through which gas used for controlling an atmosphere of the target regions of the to-be-processed object is introduced or exhausted. The first and second nozzles may face each other so that the laser beams emitted from the laser beam emitting unit fall therebetween. The apparatus may further include a moving unit, which horizontally moves the to-be-processed object, to which the laser beams are emitted, at approximately the same transport speed.

7 Claims, 8 Drawing Sheets

FIG. 6

| n$^{th}$ REFLECTOR / NUMBER N OF REFLECTORS | FIRST REFLECTANCE (TRANSMITTANCE) | SECOND REFLECTANCE (TRANSMITTANCE) | THIRD REFLECTANCE (TRANSMITTANCE) | FOURTH REFLECTANCE (TRANSMITTANCE) | FIFTH REFLECTANCE (TRANSMITTANCE) | SIXTH REFLECTANCE (TRANSMITTANCE) |
|---|---|---|---|---|---|---|
| 2 | 50% (50%) | 100% (0%) | | | | |
| 3 | 100/3% (200/3%) | 50% (50%) | 100% (0%) | | | |
| 4 | 25% (75%) | 100/3% (200/3%) | 50% (50%) | 100% (0%) | | |
| 5 | 20% (80%) | 25% (75%) | 100/3% (200/3%) | 50% (50%) | 100% (0%) | |
| 6 | 100/6% (500/6%) | 20% (80%) | 25% (75%) | 100/3% (200/3%) | 50% (50%) | 100% (0%) |

LASER ANNEALING APPARATUS FOR PROCESSING SEMICONDUCTOR DEVICES IN INLINE MANNER

BACKGROUND OF THE INVENTION

This application claims the priority of Korean Patent Application No. 2003-84899, filed on Nov. 27, 2003, in the Korean Intellectual Property Office, the disclosure of which is herein incorporated by reference in its entirety.

FIELD OF THE INVENTION

The present invention relates to a laser annealing apparatus for processing a plurality of semiconductor devices in an inline manner, and more particularly, to a laser annealing apparatus for processing a plurality of moving semiconductor devices in an inline manner using one annealing laser and a plurality of reflectors to manufacture highly reliable semiconductor devices rapidly with reduced manufacturing costs.

DESCRIPTION OF THE RELATED ART

An Amorphous Silicon Thin Film Transistor (a-Si TFT) has been used as a switching element of an Active Matrix-Organic Electro Luminescence Display (AM-OLED) or an Active Matrix-Liquid Crystal Display (AM-LCD). However, as demands for high quality displays continue to increase, a Polycrystalline Silicon Thin Film Transistor (poly-Si TFT), which is faster in operation speed than the a-Si TFT, is now widely used as a switching element of a display.

To manufacture the poly-Si TFT, a crystallization process is added to a method of manufacturing the a-Si TFT. A general heat treatment and an excimer laser annealing (ELA) process may be used for the crystallization process. However, the general heat treatment has a problem in that a glass substrate used as a substrate of an OLED or an LCD is exposed to a high temperature atmosphere of 600° C. or more, and thus, the possibility of damage to to-be-processed objects increases. Therefore, an ELA process is mainly used.

The ELA process is performed such that a laser beam having high energy is applied to a target region, which is to be crystallized, of an amorphous silicon thin film to instantaneously heat the target region, for example, within a few tens of nanoseconds, thereby preventing the glass substrate from being damaged. Further, a polycrystalline silicon thin film manufactured using the ELA process is superior in electrical characteristics to a polycrystalline silicon thin film manufactured using the general heat treatment. This is because when the amorphous silicon thin film, melted into a liquid state by the excimer laser beam, solidifies, silicon atoms are rearranged in the form of grains having superior crystallinity (see Appl. Phys. Lett. Vol. 63, no. 14, p. 1969, 1993). For example, when an electron mobility of the a-Si TFT is approximately 1 to 2 $cm^2/Vsec$ and an electron mobility of the poly-Si TFT manufactured by the general heat treatment is approximately 10 to 20 $cm^2/Vsec$, an electron mobility of the poly-Si TFT manufactured using the ELA process exceeds 100 $cm^2/Vsec$ (see IEEE Trans. Electron Devices, vol. 36, no. 12, p. 2868, 1989).

In connection with an apparatus for manufacturing semiconductor devices using the ELA process, U. S. Pat. No. 6,580,053 discloses a laser annealing apparatus, wherein gas, such as helium, neon, argon, nitrogen, etc. is strongly sprayed through a plurality of nozzles to a surface of an amorphous semiconductor material to form an atmosphere suitable for a laser annealing process, and a high quality polycrystalline region is formed through the laser annealing process, as shown in FIG. 1.

Referring to FIG. 1, a substrate 55 and an amorphous silicon film 50 are stacked on a movable stage 30, and a laser beam 15 is emitted from a laser head 11 through a beam homogenizing device 17 to a target region 52, which is to be crystallized, on a surface 51 of the amorphous silicon film 50. Gas, such as helium, neon, argon, nitrogen, etc., output from a gas supply 23 passes through a pump 24, a valve 25, and a pipe 26 and is sprayed through nozzles 21 and 22 to the surface 51 of the amorphous silicon film 50. The gas sprayed through the nozzles 21 and 22 is outwardly exhausted through a separate exhaust port.

The conventional laser annealing apparatus has a drawback, however, because just one semiconductor device can be manufactured using one annealing laser, and a cleaning process should be individually performed on each semiconductor device. As a result, manufacturing processes are complex and rapid manufacture cannot be achieved.

SUMMARY OF THE INVENTION

The present invention provides a laser annealing apparatus, which can simultaneously process a plurality of moving semiconductor devices in an inline manner using one annealing laser.

The present invention further provides a laser annealing apparatus, which can rapidly move a plurality of semiconductor devices subjected to an annealing process.

The present invention further provides a laser annealing apparatus, which can rapidly clean a plurality of semiconductor devices before and after an annealing process.

An aspect of the present invention provides a laser annealing apparatus that may be used to process semiconductor devices in an inline manner. The apparatus may include a laser beam emitting unit, which emits laser beams to target regions of a to-be-processed object, a plurality of first nozzles, and a plurality of second nozzles, through which gas used for controlling an atmosphere of the target regions of the plurality of to-be-processed objects is introduced or exhausted. The first and second nozzles face each other with the laser beams therebetween emitted from the laser beam emitting unit. A moving unit horizontally moves the plurality of to-be-processed objects, to which the laser beams are emitted at the same speed.

The laser beam emitting unit may include a laser head, which emits the laser beams, and a plurality of reflectors, which reflect part of the laser beams emitted from the laser head and transmit other parts of the laser beams. The plurality of reflectors may have predetermined sequential reflectances respectively so that laser beams having the same power can be applied to the plurality of target regions on the plurality of to-be-processed objects. For example, when the number of the plurality of reflectors is N, a reflectance of an $n^{th}$ reflector from the laser head may be $1/((N-n)+1)$ and a transmittance of the $n^{th}$ reflector from the laser head may be $(N-n)/((N-n)+1)$.

The plurality of first nozzles may be gas inlets, and the plurality of second nozzles may be gas outlets, such that gas introduced from one side can be easily discharged to the other side.

The moving unit may include movable stages, which temporarily carry thereon the to-be-processed objects, and a driving unit, which horizontally moves the movable stages. The driving unit may drive the movable stages when the laser beams are not emitted faster than when the laser beams are emitted, thereby allowing the semiconductor devices to be fast manufactured and improving productivity. For example, the moving unit may further comprise a transport speed adjusting photo-detector, which is vertically spaced apart from a horizontal trajectory of the plurality of to-be-processed objects and detects positions of the plurality of to-be-processed objects. The driving unit may change the transport speed of the movable stages according to whether the transport speed adjusting photo-detector detects light or not. For example, the moving unit may include first and second transport speed adjusting photo-detectors, and the driving unit may measure a time taken from when the first transport speed adjusting photo-detector detects the movable stages to when the second transport speed adjusting photo-detector detects the movable stages to calculate a current transport speed of the movable stages, and adjust the transport speed of the movable stages according to the calculation results.

The laser beam emitting unit may further include a laser adjusting photo-detector, which is vertically spaced apart from a horizontal trajectory of the plurality of to-be-processed objects and detects positions of the plurality of to-be-processed objects; and a shutter, which cuts off the laser beams according to whether the laser adjusting photo-detector detects light.

Meanwhile, the apparatus may further include a cleaning unit, which is installed at a level with the laser beam emitting unit and the plurality of nozzles. Accordingly, the moving unit may move the plurality of to-be-processed objects during a laser annealing process at the same speed as the plurality of to-be-processed objects are moved during a cleaning process in the cleaning unit. In this manner, the to-be-processed objects, which have been cleaned before the laser annealing process, can be transported smoothly when the annealing process starts. Furthermore, the to-be-processed objects, which have been laser-annealed after the cleaning process, can be transported smoothly when the laser annealing process ends. In one embodiment, the moving unit may extend into the cleaning unit so that a separate moving unit for moving the plurality of to-be-processed objects need not be installed inside the cleaning unit. In this case, since delay time between the cleaning process in the cleaning unit and the laser annealing process is rarely needed, a fast and exact movement can be ensured.

BRIEF DESCRIPTION OF THE DRAWINGS

The above and other features and advantages of the present invention will become more apparent by describing in detail exemplary embodiments thereof with reference to the attached drawings.

FIG. 6 is a table showing desirable reflectance and transmittance of an $n^{th}$ reflector when the number of to-be-processed objects and reflectors is N.

DETAILED DESCRIPTION OF THE INVENTION

The present invention will now be described more fully with reference to the accompanying drawings, in which preferred embodiments of the invention are shown.

Figure 1:
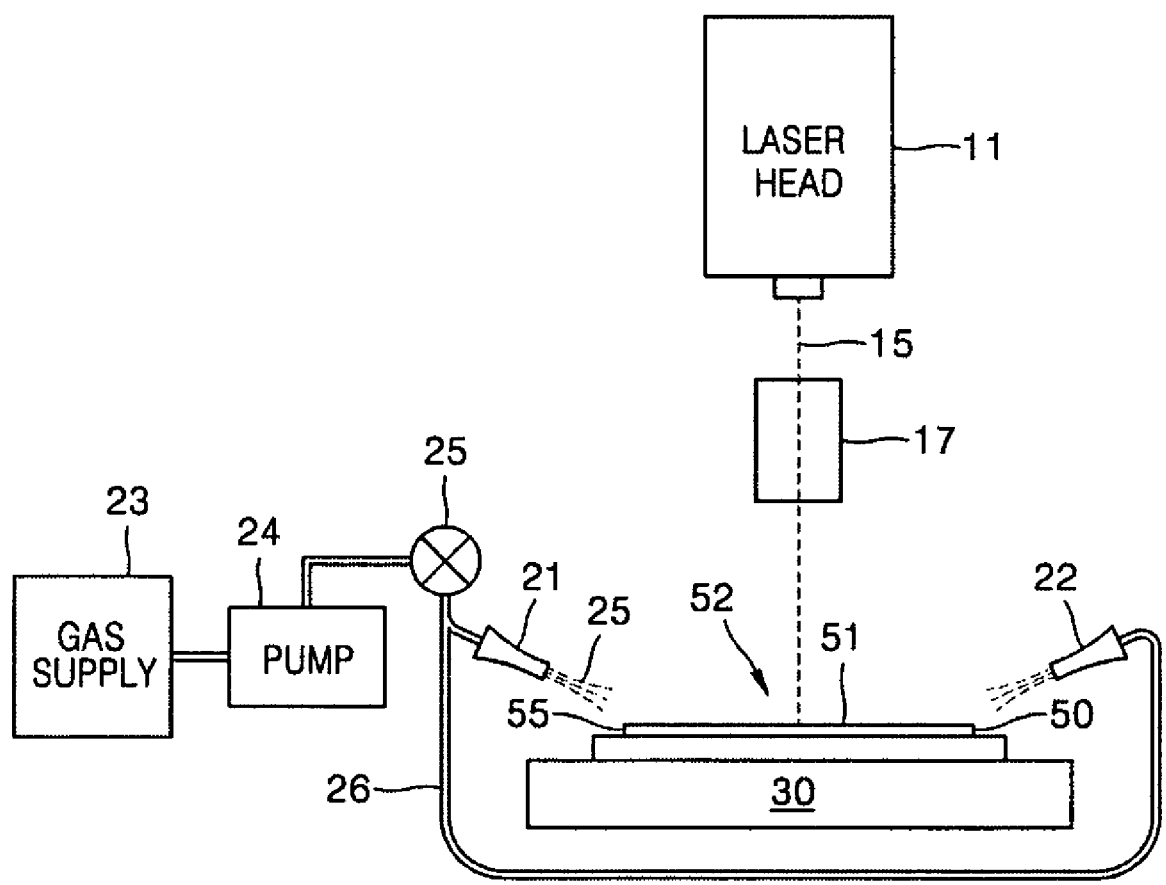
FIG. 1 is a schematic block diagram of a conventional laser annealing apparatus.
Figure 2:
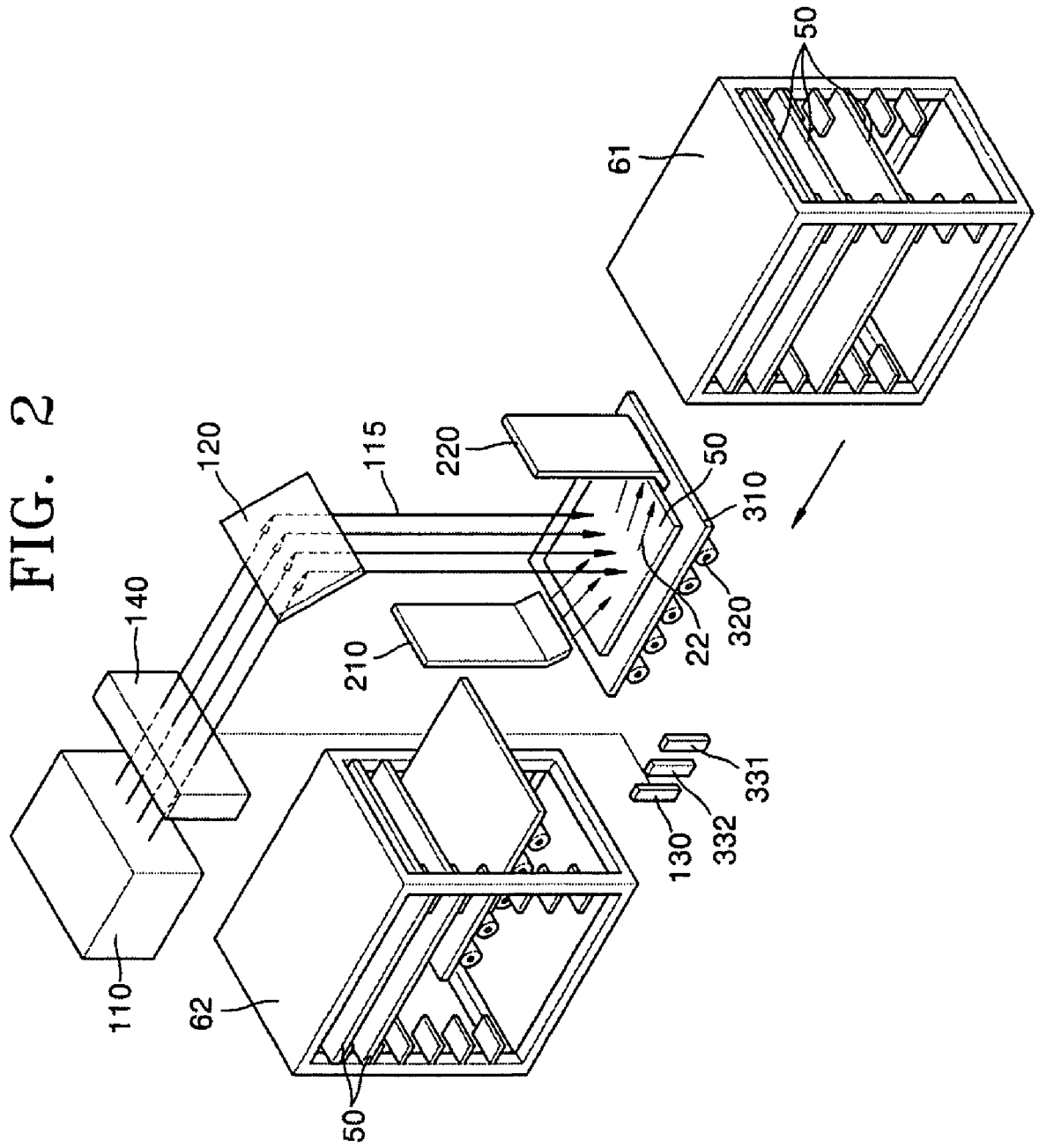
FIG. 2 is a perspective view illustrating an embodiment where a to-be-processed object 50 is processed while being moved in the conventional laser annealing apparatus of FIG. 1.

FIG. 2 is a perspective view illustrating an embodiment where a to-be-processed object 50 is processed while being moved in the laser annealing apparatus of FIG. 1. Referring to FIG. 2, to process objects in an open type chamber in an inline manner, gas, such as helium, neon, argon, nitrogen, etc., is introduced strongly through a nozzle 210, which is disposed on a left side of the to-be-processed object 50, and is exhausted strongly through a nozzle 220, which is disposed on a right side of the to-be-processed object 50. If there is no difficulty in forming an atmosphere suitable for a laser annealing process, both the left nozzle 210 and the right nozzle 220 can be gas inlets. A laser beam 115 having a predetermined power output from a laser head 110 is reflected by a reflector 120. The reflected laser beam 115 is emitted to a target region 52 on the to-be-processed object 50, which is a semiconductor device, so that an amorphous silicon thin film can be crystallized. Each laser beam 115 has a circular section, but in FIG. 2, the laser annealing apparatus is constructed such that a plurality of laser beams are simultaneously emitted horizontally in order to perform the laser annealing process in the inline manner.

The to-be-processed object 50 is temporarily placed on a movable stage 310 and is horizontally moved along with the movable stage 310. The movable stage 310 is horizontally moved by a driving unit 320, and the driving unit 320 may be a roller or a conveyer belt. The movable stage 310 is moved to the left from the right of FIG. 2, and has a right end connected to an input cassette 61 in which an input to-be-processed object 50 is received and a left end connected to an output cassette 62 in which an output to-be-processed object 50 is received.

Accordingly, after the to-be-processed object 50 is discharged from the input cassette 61, the to-be-processed object is placed on the movable stage 310 to be horizontally moved to the left at a predetermined speed. While being horizontally moved, the target region on the to-be-processed object 50 is subjected to the laser annealing process in a direction from left to right by the laser beam 115 under a predetermined atmosphere formed by the gas sprayed through the nozzles 210 and 220. The to-be-processed object 50, which has been laser-annealed while being horizontally moved, is output to the left output cassette 62.

A laser adjusting photo-detector 130 or first and second transport speed adjusting photo-detectors 331 and 332 may be disposed above or below the movable stage 310 and the driving unit 320. The photo-detectors 130, 331, and 332 may use light, which is emitted from a separately installed light emitting diode (not shown) and is reflected from the movable stage 310, or natural light around the apparatus.

For example, the laser adjusting photo-detector 130 is vertically spaced apart from a horizontal trajectory of the to-be-processed object 50, and is coupled to a shutter 140, which determines whether a laser beam is output, at an input end or an output end of the laser head 110. The shutter 140 determines a position of the to-be-processed object 50 according to whether the laser adjusting photo-detector 130 detects light, and cuts off the laser beam 115.

Further, the first and second transport speed adjusting photo-detectors 331 and 332 are vertically spaced apart from the horizontal trajectory of the to-be-processed object 50, and are coupled to the driving unit 320. The driving unit 320 changes a transport speed of the movable stage 310 according to whether the transport speed adjusting photo-detectors 331 and 332 detect light. For example, the driving unit 320 can transport the movable stage 310 and the to-be-processed object 50 at a high speed before the first transport speed adjusting photo-detector 331 detects light reflected from the movable stage 310, and can reduce the transport speed of the movable stage and the object 50 to a speed suitable for the laser annealing process as soon as the first transport speed adjusting photo-detector 331 detects the light reflected from the movable stage 310.

In the meantime, it is preferable that the transport speed is detected and readjusted in preparations for a possible error. For example, a time taken from when the first transport speed adjusting photo-detector 331 detects the light reflected from the movable stage 310 to when the second transport speed adjusting photo-detector 332 detects the light reflected from the movable stage 310 is measured to know a current transport speed. If the current transport speed is faster or slower than a transport speed suited for the laser annealing process, the current transport speed is preferably fed back to the driving unit 320 such that the transport speed is readjusted to a level of the speed suitable for the laser annealing process.

Figure 3:
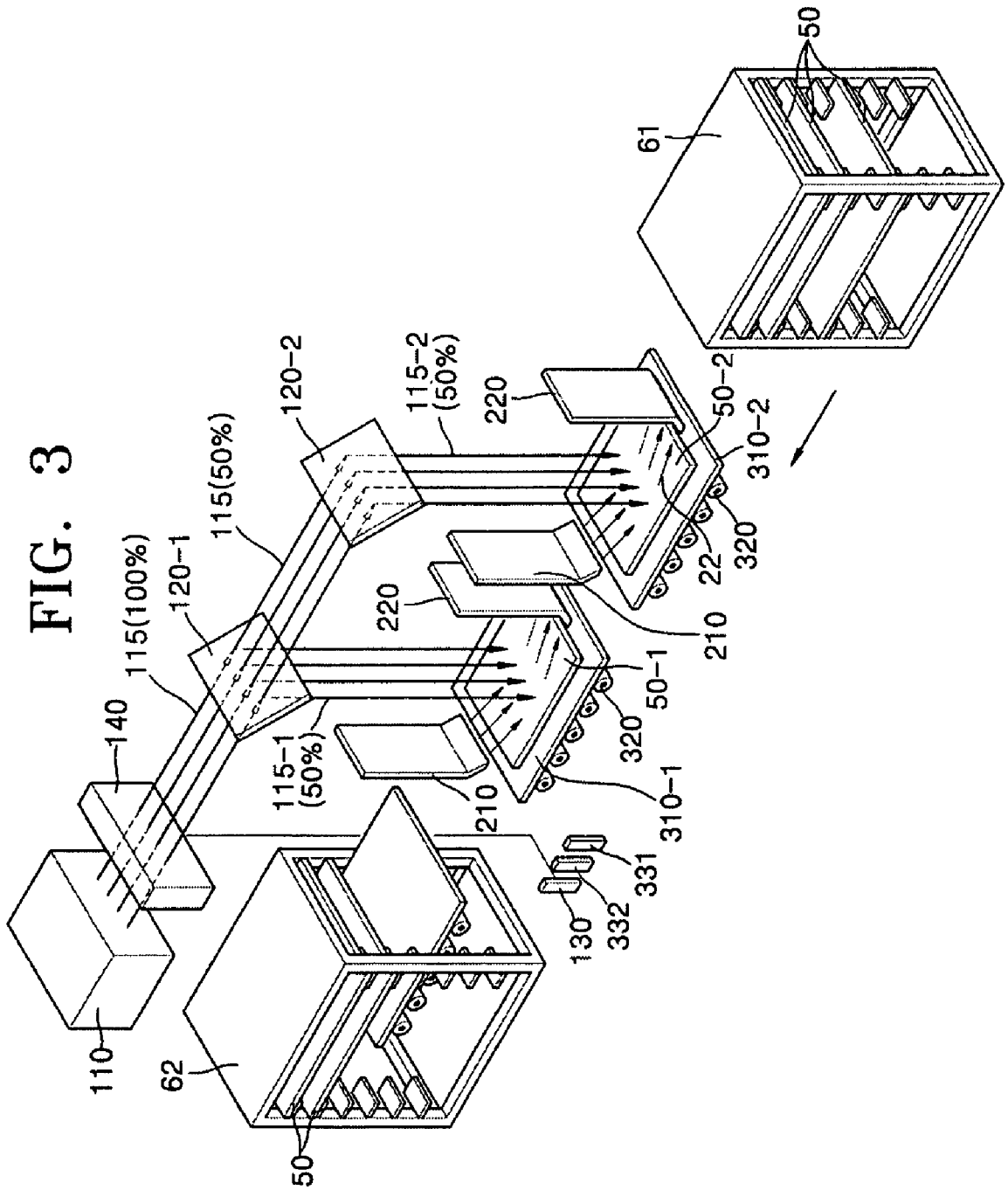
FIG. 3 is a perspective view illustrating an embodiment where a to-be-processed object is processed in an inline manner while being moved in a laser annealing apparatus according to the present invention.

FIG. 3 is a perspective view illustrating an embodiment where two to-be-processed objects 50-1, and 50-2 are processed in an inline manner while being moved in a laser annealing apparatus according to the present invention. FIG. 3 is different from FIG. 2 in that transport speeds of movable stages 310-1 and 310-2 and the plurality of to-be-processed objects 50-1 and 50-2 placed on the movable stages 310-1 and 310-2 are changed equally, and accordingly, the plurality of to-be-processed objects 50-1 and 50-2 can be processed in an inline manner.

The laser beam 115 having the predetermined power output from the laser head 110 is reflected by a plurality of reflectors 120-1 and 120-2 Laser beams 115-1 and 115-2 respectively reflected by the reflectors 120-1 and 120-2are emitted on target regions on the to-be-processed objects 50-1 and 50-2 which are semiconductor devices, so that amorphous silicon thin films can be crystallized. Each laser beam 115 has a circular section, and in FIG. 3, the laser annealing apparatus is constructed such that a plurality of laser beams are horizontally emitted at the same time in order to perform a laser annealing process in an inline manner.

The plurality of reflectors 120-1 and 120-2 have predetermined reflectances with respect to powers of the input laser beams. That is, the plurality of reflectors 120-1 and 120-2 have sequential reflectances so that laser beams having the same power can be emitted to the plurality of target regions 52.

Here, when the number of the reflectors is N, a reflectance of an $n^{th}$ reflector from the laser head 110 is preferably $1/((N-n)+1)$ in order to emit homogenous laser beams. That is, for example, when three objects are processed in an inline manner, three reflectors are necessary in order to emit laser beams having the same power. For laser beams having an equal power of 33.3% to be reflected from the first, second, and third reflectors 120-1, 120-2, and 120-3, the first reflector 120-1 must have a reflectance of 33.3%, the second reflector 120-2 must have a reflectance of 50%, and the third reflector 120-3 must have a reflectance of 100%. The second reflector 120-2 reflects a laser beam with a power of 33.3% corresponding to a half of a total power of 66.6% of light transmitting through the first reflector 120-1, and the third reflector 120-3 reflects a laser beam with a power of 33.3% corresponding to 100% of a total power of 33.3% of light transmitting through the second reflector 120-2.

The plurality of to-be-processed objects 50-1 and 50-2 are temporarily placed on the movable stages 310-1 and 310-2 and are horizontally moved along with the movable stages 310-1 and 310-2 The movable stages 310-1, 310-2, . . . are horizontally moved by the driving unit 320, and the driving unit 320 may be a roller or a conveyer belt. Each of the movable stages 310-1 and 310-2 is moved to the left from the right of FIG. 3, and has a right end connected to the input cassette 61 in which a plurality of input to-be-processed objects 50 are received and a left end connected to the output cassette 62 in which a plurality of output to-be-processed objects 50 are received.

Accordingly, after the plurality of to-be-processed objects 50-1 and 50-2 are output from the input cassette 61, they are placed on the movable stages 310-1 and 310-2 to be horizontally moved to the left at a predetermined speed. The target regions 52 of the plurality of to-be-processed objects 50-1 and 50-2 are subjected to a laser annealing process while being moved in a direction from left to right by the laser beams 115-1 and 115-2 under a predetermined atmosphere formed by the gas sprayed through the nozzles 210 and 220. The plurality of to-be-processed objects 50-1 and 50-2, which have been laser-annealed while being horizontally moved, are output to the left output cassette 62.

The laser adjusting photo-detector 130 or the first and second transport speed adjusting photo-detectors 331 and 332 may be disposed above or below the movable stages 310-1 and 310-2 and the driving unit 320. The photo-detectors 130, 331, and 332 may use light, which is emitted from a separately installed light emitting diode (not shown) and is reflected from the movable stages 310-1 and 310-2 or natural light around the apparatus.

For example, the laser adjusting photo-detector 130 is vertically spaced apart from a horizontal trajectory of each of the to-be-processed objects 50-1 and 50-2 and is coupled to the shutter 140, which determines whether the laser beams are output, at the input end or the output end of the laser head 110. The shutter 140 determines positions of the to-be-processed objects 50-1 and 50-2 according to whether the laser adjusting photo-detector 130 detects light and cuts off the laser beam 115.

Further, the first and second transport speed adjusting photo-detectors 331 and 332 are vertically spaced apart from the horizontal trajectory of each of the to-be-processed objects 50-1 and 50-2 and are coupled to the driving unit 320. The driving unit 320 changes a transport speed of the movable stages 310-1 and 310-2 according to whether the first and second transport speed adjusting photo-detectors 331 and 332 detect light. For example, the driving unit 320 moves the movable stages 310-1 and 310-2 and the to-be-processed objects 50-1 and 50-2 at a high speed before the first transport speed adjusting photo-detector 331 detects light reflected by the movable stages 310-1 and 310-2, and reduces the transport speed of the movable stages 310-1 and 310-2 and the objects 50-1 and 50-2 to a speed suitable for the laser annealing process as soon as the first transport speed adjusting photo-detector 331 detects the light reflected by the movable stages 310-1 and 310-2.

In the meantime, it is preferable that the transport speed is detected and readjusted in preparation for a possible error. For example, a time taken from when the first transport speed adjusting photo-detector 331 detects the laser beams reflected by the movable stages 310-1 and 310-2 to when the second transport speed adjusting photo-detector 332 detects the laser beams reflected by the movable stages 310-1 and 310-2 is measured to know a current transport speed. If the current transport speed is faster or slower than the transport speed suitable for the laser annealing process, the current transport speed is preferably fed back to the driving unit 320 to be readjusted to a level equal to the speed suitable for the laser annealing process.

Here, since the transport speeds of the movable stages 310-1 and 310-2 are equal to each other, as shown in FIG. 3, the proper number of the respective photo-detectors 130, 331, and 332 can be 1.

Figure 4:
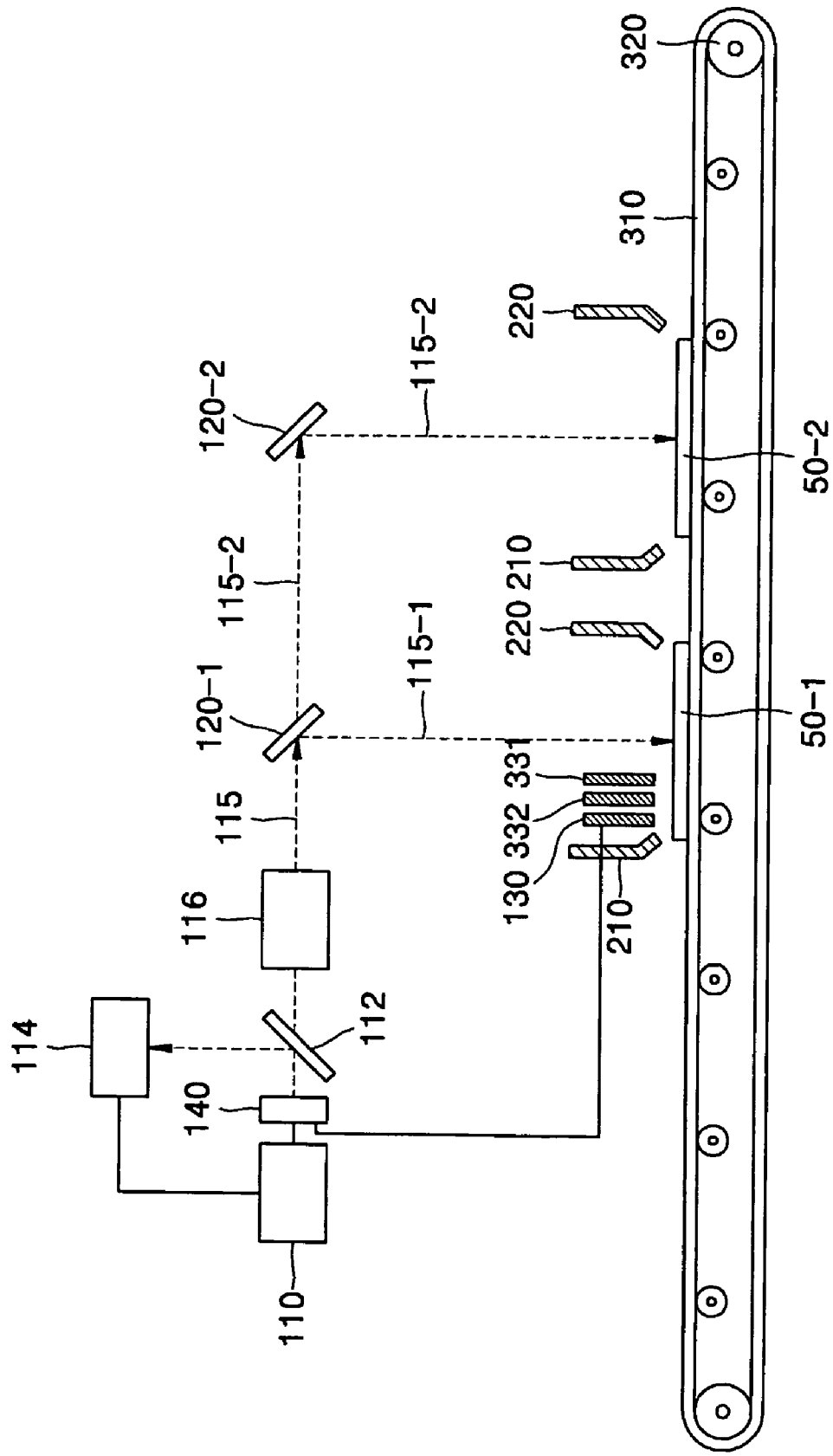
FIG. 4 is a side view illustrating an embodiment where two to-be-processed objects are processed in an inline manner while being moved in the laser annealing apparatus according to the present invention.

FIG. 4 is a side view illustrating an embodiment where two to-be-processed objects 50-1 and 50-2 are processed in an inline manner while being moved in the laser annealing apparatus according to the present invention. The laser beam 115 is emitted from the laser head 110, and most part of the laser beam 115 transmits through an energy detecting reflector 112 while the shutter 140 is opened, and extremely small part of the laser beam 115 is reflected to a feed-back controller 114. The feed-back controller 114 is coupled to a power supply and the laser head 110. The feed-back controller 114 measures the emitted laser beam 115 to adjust the power of the output laser beam 115.

The laser beam 115 transmitting through the energy detecting reflector 112 is applied to an optical adjuster 116, which adjusts the size of the laser beam 115 and energy distribution. Thereafter, a laser beam 115-1 of 50% of energy is reflected by the first reflector 120-1, and a laser beam 115-2 of remaining 50% of energy transmits through the first reflector 120-1. The laser beam 115-1 of the reflected 50% of energy is emitted to the target region of the first to-be-processed object 50-1. The laser beam 115-2 of the remaining 50% of energy transmitting through the first reflector 120-1 is reflected 100% by the second reflector 120-2 and is emitted to the target region of the second to-be-processed object 50-2, which is moved at the same speed as the first to-be-processed object 50-1. At this time, the nozzles 210 and 220 through which atmosphere processing gas is introduced or exhausted are disposed at both sides of the respective to-be-processed objects 50-1 and 50-2. If the photo-detector 130 detects that the to-be-processed objects 50-1 and 50-2 have reached sections to which the laser beam is to be emitted, the atmosphere processing gas is strongly introduced or exhausted through the nozzles 210 and 220 such that the shutter 140 is opened and the laser beam 115 is emitted. To accurately perform the laser annealing process on the first to-be-processed object 50-1 and the second to-be-processed object 50-2, the transport speed adjusting photo-detectors 331 and 332 detect the transport speed of the first and second to-be-processed objects 50-1 and 50-2 and the driving unit 320 adjusts the transport speed.

Figure 5:
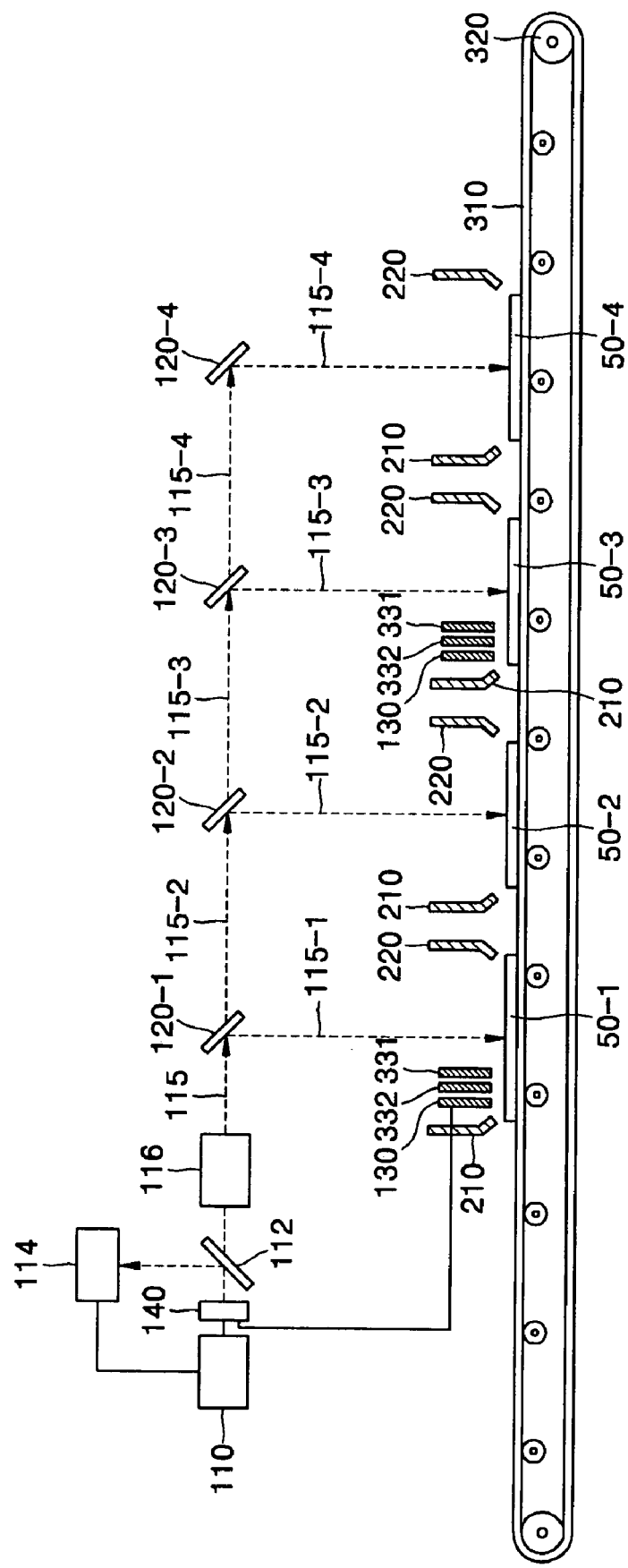
FIG. 5 is a side view illustrating an embodiment where four to-be-processed objects are processed in an inline manner while being moved in the laser annealing apparatus according to the present invention.

FIG. 5 is a side view illustrating an embodiment where four to-be-processed objects 50-1, 50-2, 50-3, and 50-4 are processed in an inline manner while being moved in the laser annealing apparatus according to the present invention. The laser beam 115 is emitted from the laser head 110, and most part of the laser beam 115 transmits through the energy detecting reflector 112 while the shutter 140 is opened and extremely small part of the laser beam 115 is reflected to the feed-back controller 114. The feed-back controller 114 is coupled to the power supply unit and the laser head 110. The feed-back controller 114 measures the energy of the emitted laser beam 115 to adjust the power of the output laser beam 115.

The laser beam 115 transmitting through the energy detecting reflector 112 is applied to the optical adjuster 116. The optical adjuster 116 adjusts the size of the laser beam 115 and energy distribution. Thereafter, a laser beam 115-1 of 25% of energy is reflected by the first reflector 120-1, and a laser beam of remaining 75% of energy transmits through the first reflector 120-1. When the first laser beam 115 is assumed to have a power of 100 KW, the laser beam reflected by the first reflector 120-1 has a power of 25 KW. The reflected laser beam 115-1 of the 25% of energy corresponding to 25 KW is emitted to the target region of the first to-be-processed object 50-1. A laser beam 115-2 of the remaining 75% of energy corresponding to 75 KW transmitting through the first reflector 120-1 is reflected 33.3% by the second reflector 120-2 to have a power of 25 KW, and is emitted to the target region of the second to-be-processed object 50-2, which is moved at the same speed as the first to-be-processed object 50-2. A laser beam 115-3 of the remaining 66.6% of energy corresponding to 50 KW transmitting through the second reflector 120-2 is reflected 50% by the third reflector 120-3 to have a power of 25 KW, and is emitted to the target region of the third to-be-processed object 50-3, which is moved at the same speed as the first and second to-be-processed objects 50-1 and 50-2. A laser beam 115-4 of the remaining 50% of energy corresponding to 25 KW transmitting through the third reflector 120-3 is reflected 100% by the fourth reflector 120-4 to have a power of 25 KW, and is emitted to the target region of the fourth to-be-processed object 50-4, which is moved at the same speed as the first, second, and third to-be-processed objects 50-1, 50-2, and 50-3.

Here, the nozzles 210 and 220 through which the atmosphere processing gas is introduced or exhausted are disposed at both sides of the respective to-be-processed objects 50-1, 50-2, 50-3, and 50-4. If the photo-detector 130 detects that the to-be-processed objects 50-1, 50-2, 50-3, and 50-4 have reached sections to which the laser beam is to be emitted, the atmosphere processing gas is strongly introduced or exhausted through the nozzles 210 and 220 such that the shutter 140 is opened and the laser beams 115-1, 115-2, 115-3, and 115-4 are emitted. To accurately perform the laser annealing process on the to-be-processed objects 50-1, 50-2, 50-3, and 50-4, the transport speed adjusting photo-detectors 331 and 332 detect the transport speed of the to-be-processed object 50-1, 50-2, 50-3, and 50-4, and the driving unit 320 adjusts the transport speed.

It is necessary to properly adjust reflectance and transmittance of each reflector according to the number of to-be-processed objects 50, which are annealed simultaneously. That is, the reflectors must have predetermined sequential reflectances so as to emit laser beams having the same power to the plurality of target regions on the plurality of to-be-processed objects. For example, if the number of reflectors is N, it is preferable that a reflectance of an $n^{th}$ reflector from the laser head 100 is $1/((N-n)+1)$ and a transmittance of the $n^{th}$ reflector from the laser head 110 is $(N-n)(N-n+1)$.

When the number of the to-be-processed objects 50, namely, the number of the reflectors, is N, desired reflectance and transmittance of an $n^{th}$ reflector are shown in table of FIG. 6. For example, when the number N of the to-be-processed objects 50, namely, the number of the reflectors is 5, it is preferable that a reflectance of a first reflector is 20%, a reflectance of a second reflector is 25%, a reflectance of a third reflector is 33.3%, a reflectance of a fourth reflector is 50%, and a reflectance of a fifth reflector is 100%. In this case, if the power of the laser beam emitted from the laser head 110 is assumed to be 100 KW, the laser beams emitted to the five to-be-processed objects 50 have an equal power of 20 KW.

If the reflectances of the reflectors are determined in the above manner, the energy of the reflected laser beam 115 is homogeneously distributed through the respective reflectors and laser beams having homogeneous energy are emitted to the to-be-processed objects 50-1 and 50-2 thereby easily performing a uniform laser annealing process.

Figure 7:
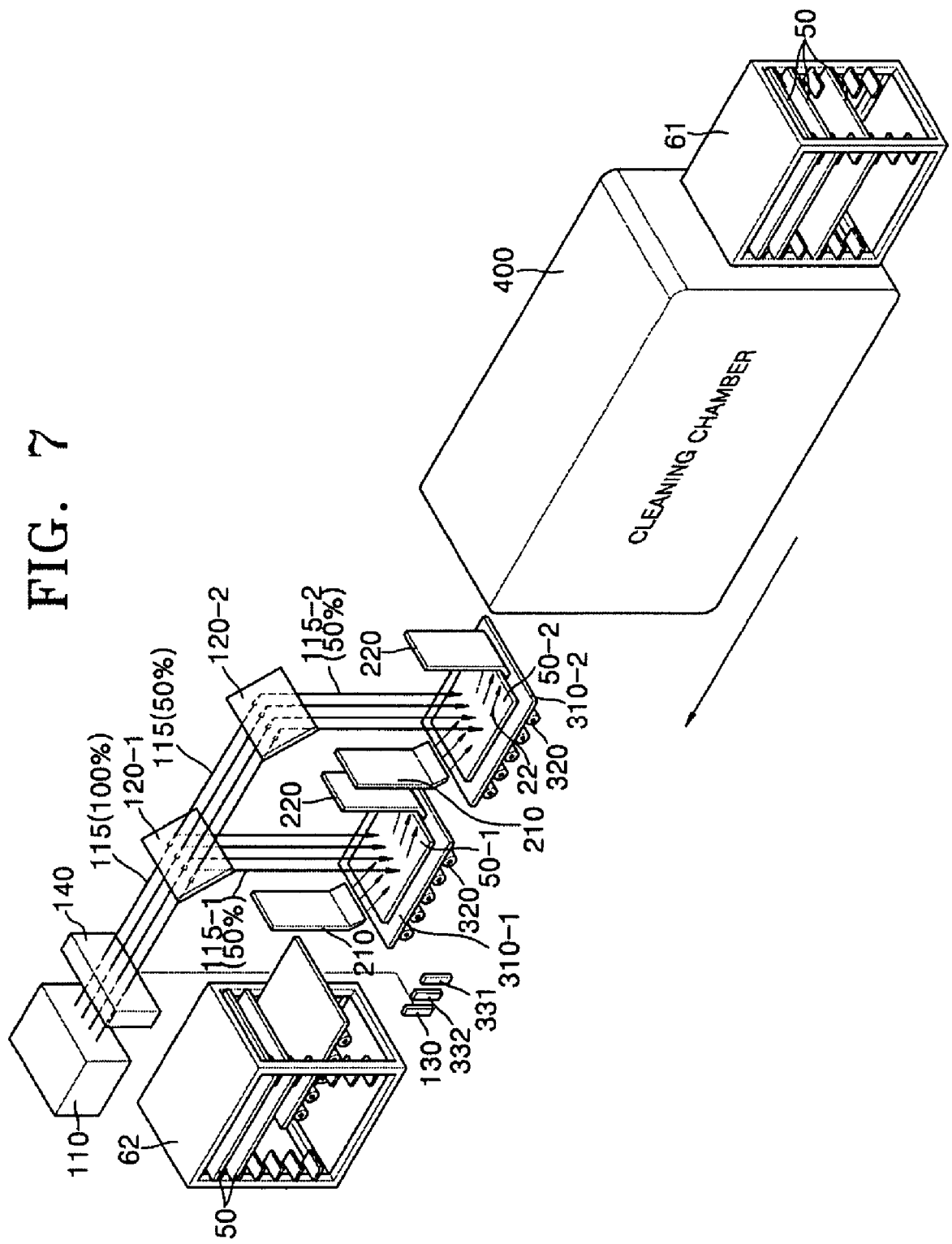
FIG. 7 is a perspective view illustrating an embodiment where a cleaning unit is integrally coupled to the laser annealing apparatus according to the present invention.
Figure 8:
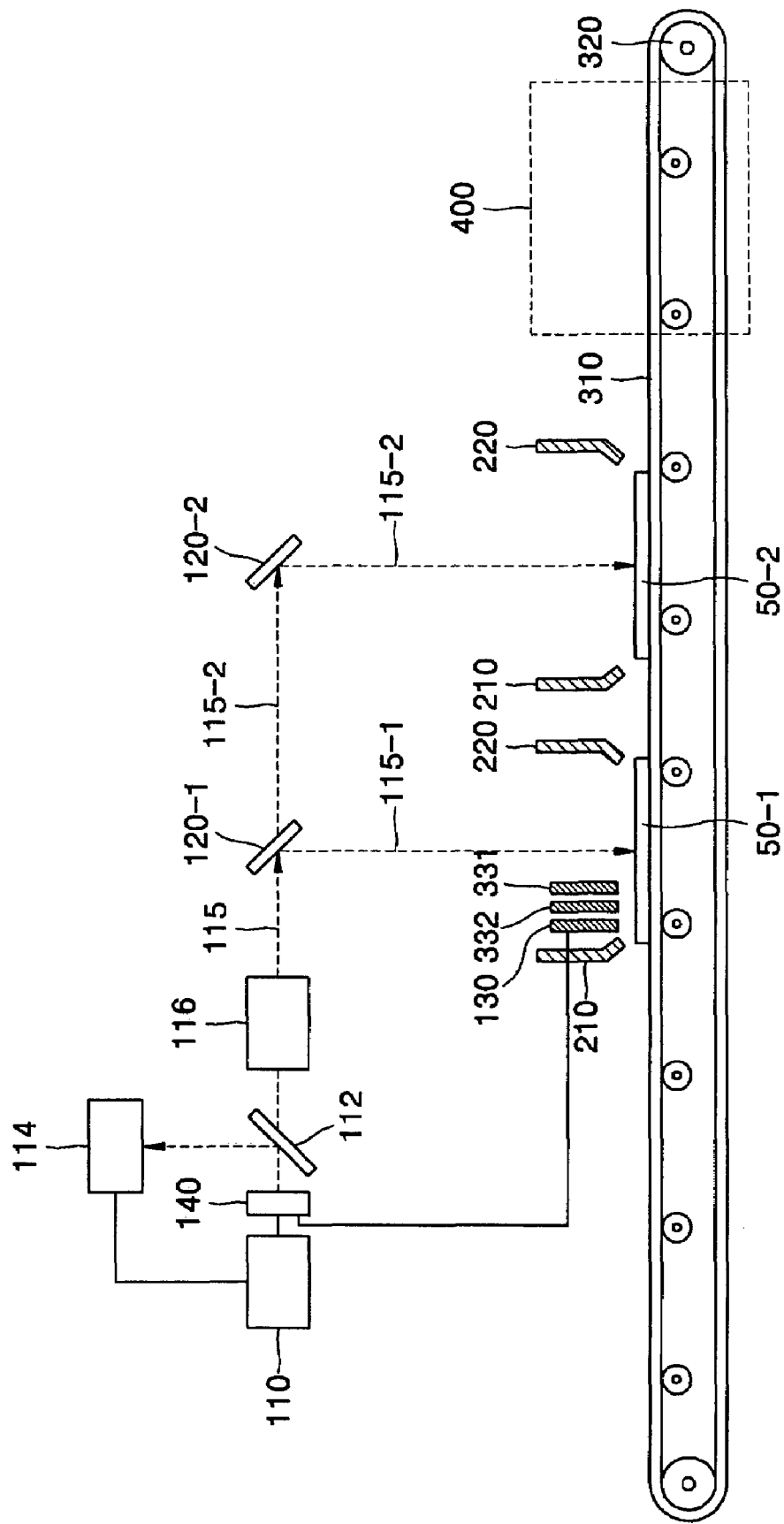
FIG. 8 is a side view of the embodiment of FIG. 7.

FIG. 7 is a perspective view illustrating an embodiment where a cleaning unit 400 is integrally coupled to the laser annealing apparatus according to the present invention, and FIG. 8 is a side view of the embodiment of FIG. 7.

The laser annealing apparatus for processing the plurality of semiconductor devices in the inline manner may further include the cleaning unit 400, which is installed at a level with the laser emitting unit including the reflectors 120-1 and 120-2 and the nozzles 210 and 220. Here, a moving unit is preferably constructed such that a to-be-processed object 50-1 experiencing the laser annealing process is moved at the same speed as a to-be-processed object 50 experiencing a cleaning process in the cleaning unit 400. Since the to-be-processed objects 50-1 and 50have the same transport speed, another to-be-processed object 50, which has been cleaned before the laser annealing process and then is introduced to be laser-annealed rarely needs to wait for the start of the laser annealing process. Accordingly, the to-be-processed object 50 can be smoothly moved for the change from the cleaning process to the laser annealing process. Here, for example, the moving unit may be extended into the cleaning unit 400 to be integrally formed with the cleaning unit 400. That is, if the moving unit that moves one or more to-be-processed objects 50 is not additionally installed inside the cleaning unit 400 but is integrally coupled to the cleaning unit 400, the transport speed during the cleaning process in the cleaning unit 400 becomes the same as that during the laser annealing process, thereby almost eliminating delay time between the two processes and allowing smooth process conversion. The driving unit 320 of the moving unit may be a driving motor of a conveyer belt or a roller. If the driving unit 320 during the laser annealing process is also used during the cleaning process, the transport speed during the laser annealing process can be equal to that during the cleaning process.

As described above, the laser annealing apparatus according to the present invention can simultaneously process the plurality of moving semiconductor devices using one annealing laser and can rapidly transport the plurality of semiconductor devices.

Also, since all the semiconductor devices are subjected to the laser annealing process at the same speed, the plurality of semiconductor devices can be easily processed. Since delay time between the cleaning process and the laser annealing process is short and uniform for all the semiconductor devices, the stability and reproducibility of the processes can be improved and productivity can be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A laser annealing apparatus to process a semiconductor in an inline manner, comprising:

a laser beam emitting unit to emit a laser beam to a target region of a semiconductor; wherein the laser beam emitting unit comprises:
 a laser head to emit the laser beam,
 a plurality of reflectors to reflect a part of the laser beam emitted from the laser head and transmit another part of the laser beam, wherein the plurality of reflectors have predetermined sequential reflectances respectively so that laser beams having the same power can be applied to the target region of the semiconductor, and when the number of the plurality of reflectors is N, a reflectance of an $n^{th}$ reflector from the laser head is $1/((N-n)+1)$;

a first nozzle and a second nozzle, through which gas used to control an atmosphere of the target region of the semiconductor is introduced or exhausted, the first nozzle and the second nozzle facing each other with the laser beam therebetween emitted from the laser beam emitting unit;

a moving unit to horizontally move a plurality of the semiconductors at approximately the same transport speed, wherein the moving unit comprises a first transport speed adjusting photo-detector that is vertically spaced apart from a horizontal trajectory of the semiconductor to detect a first position of the semiconductor, and the moving unit comprises a second transport speed adjusting photo-detector that is vertically spaced apart from the horizontal trajectory of the semiconductor to detect a second position of the semiconductor, a movable stage to carry the semiconductor on the moving unit; and a driving unit to horizontally move the movable stage, wherein the driving unit is operable to move the movable stage faster when the laser beam is not emitted than when the laser beam is emitted to the semiconductor, the driving unit is operable to change a transport speed of the movable stage according to whether the first transport speed adjusting photo-detector detects light, the driving unit is operable to measure a time from when the first transport speed adjusting photo-detector detects the semiconductor to when the second transport speed adjusting photo-detector detects the semiconductor to calculate a current transport speed of the movable stage, and the driving unit is operable to adjust the transport speed of the movable stage according to the calculation result.

2. The apparatus of claim 1, wherein the first nozzle is a gas inlet, and the second nozzle is a gas outlet.

3. The apparatus of claim 1, wherein the laser beam emitting unit, further comprises:
a laser adjusting photo-detector that is vertically spaced apart from a horizontal trajectory of the semiconductor to detect one of the first, second or a third position of the semiconductor; and
a shutter coupled to the laser adjusting photo-detector and operable to cut off the laser beam according to whether the laser adjusting photo-detector detects light.

4. The apparatus of claim 1, further comprising a cleaning unit that is installed at a level with the laser beam emitting unit and the plurality of nozzles to clean the semiconductor, wherein the moving unit is operable to move the semiconductor during a laser annealing process at a same speed as the semiconductor is moved during a cleaning process in the cleaning unit.

5. The apparatus of claim 1, wherein the moving unit extends into a cleaning unit, and the cleaning unit does not include a separate moving unit for moving the semiconductor.

6. The apparatus of claim 4, wherein the moving unit extends into the cleaning unit, and the cleaning unit does not include a separate moving unit.

7. A laser annealing apparatus to inline process a plurality of semiconductors, comprising:
- a laser beam emitting unit to emit a plurality of laser beams to target regions of a plurality of inline semiconductors; wherein the laser beam emitting unit comprises:
  - a laser head to emit the laser beam,
  - a plurality of reflectors to reflect a part of the laser beam emitted from the laser head and transmit another part of the laser beam, wherein the plurality of reflectors have predetermined sequential reflectances respectively so that laser beams having the same power can be applied to the respective target regions of the inline semiconductors, and when the number of the plurality of reflectors is N, a reflectance of an $n^{th}$ reflector from the laser head is $1/((N-n)+1)$;
- a plurality of pairs of first nozzles and second nozzles, through which gas used to control an atmosphere of the respective target regions of the semiconductors is introduced or exhausted, respective first nozzles and second nozzles facing each other with respective laser beams therebetween;
- a moving unit to horizontally move the plurality of inline semiconductors each at approximately the same transport speed, wherein the moving unit comprises a first transport speed adjusting photo-detector that is vertically spaced apart from a horizontal trajectory of the inline semiconductors to detect a first position of at least one of the inline semiconductors, and the moving unit comprises a second transport speed adjusting photo-detector that is vertically spaced apart from the horizontal trajectory of the inline semiconductors to detect a second position of the at least one semiconductor,
- a plurality of movable stages to each carry at least one of the inline semiconductors on the moving unit; and
- a driving unit to horizontally move the movable stages in line, wherein the driving unit is operable to move the movable stages faster when the laser beam is not emitted than when the laser beam is emitted to the inline semiconductors, the driving unit is operable to change a transport speed of the movable stages according to whether the first transport speed adjusting photo-detector detects light, the driving unit is operable to measure a time from when the first transport speed adjusting photo-detector detects at least one of the inline semiconductors to when the second transport speed adjusting photo-detector detects the at least one semiconductor to calculate a current transport speed of the movable stages, and the driving unit is operable to adjust the transport speed of the movable stages according to the calculation result.

* * * * *